United States Patent [19]
Rohlman

[11] Patent Number: 5,787,454
[45] Date of Patent: Jul. 28, 1998

[54] RECORDER BUFFER WITH INTERLEAVING MECHANISM FOR ACCESSING A MULTI-PARTED CIRCULAR MEMORY ARRAY

[75] Inventor: Joseph F. Rohlman, Portland, Oreg.

[73] Assignee: Intel Corporation, Santa Clara, Calif.

[21] Appl. No.: 578,964

[22] Filed: Dec. 27, 1995

[51] Int. Cl.$^6$ .......................... G06F 12/02; G06F 13/16; G11C 8/00

[52] U.S. Cl. .................. 711/5; 711/157; 365/189.02; 365/189.04; 365/250.02; 365/230.03; 365/230.05

[58] Field of Search .................... 395/405, 484, 395/510, 517, 518; 365/189.04, 233.04, 230.05, 51, 63, 230.02, 230.03, 189.02

[56] References Cited

U.S. PATENT DOCUMENTS

| | | | |
|---|---|---|---|
| 5,371,877 | 12/1994 | Drako et al. | 395/405 |
| 5,434,818 | 7/1995 | Byers et al. | 365/189.04 |
| 5,442,747 | 8/1995 | Chan et al. | 395/509 |
| 5,544,351 | 8/1996 | Lee et al. | 395/405 |

*Primary Examiner*—Eddie P. Chan
*Assistant Examiner*—Reginald G. Bragdon
*Attorney, Agent, or Firm*—Blakely, Sokoloff, Taylor & Zafman

[57] ABSTRACT

A buffer comprises a memory array, a write circuit and a read circuit. The memory array comprises one or more memory banks. Each of the memory banks is made up of a plurality of memory cells. Each memory cell has one read port and one write port. The write circuit stores a first variable number of data items to the one or more memory banks by utilizing the one write port of a portion of the memory cells. The read circuit reads a second variable number of data outputs from the one or more memory banks by utilizing the one read port of a portion of the memory cells. At least of portion of the plurality of memory cells may include one or more additional write ports which are not used for writing the first variable number of data inputs to the one or more memory banks, and at least of portion of the plurality of memory cells may include one or more additional read ports which are not used for reading the second variable number of data outputs from the one or more memory banks. Additionally, the memory array comprises one or more write bitlines that share discontinuous metal tracks with one or more read bitlines.

4 Claims, 11 Drawing Sheets

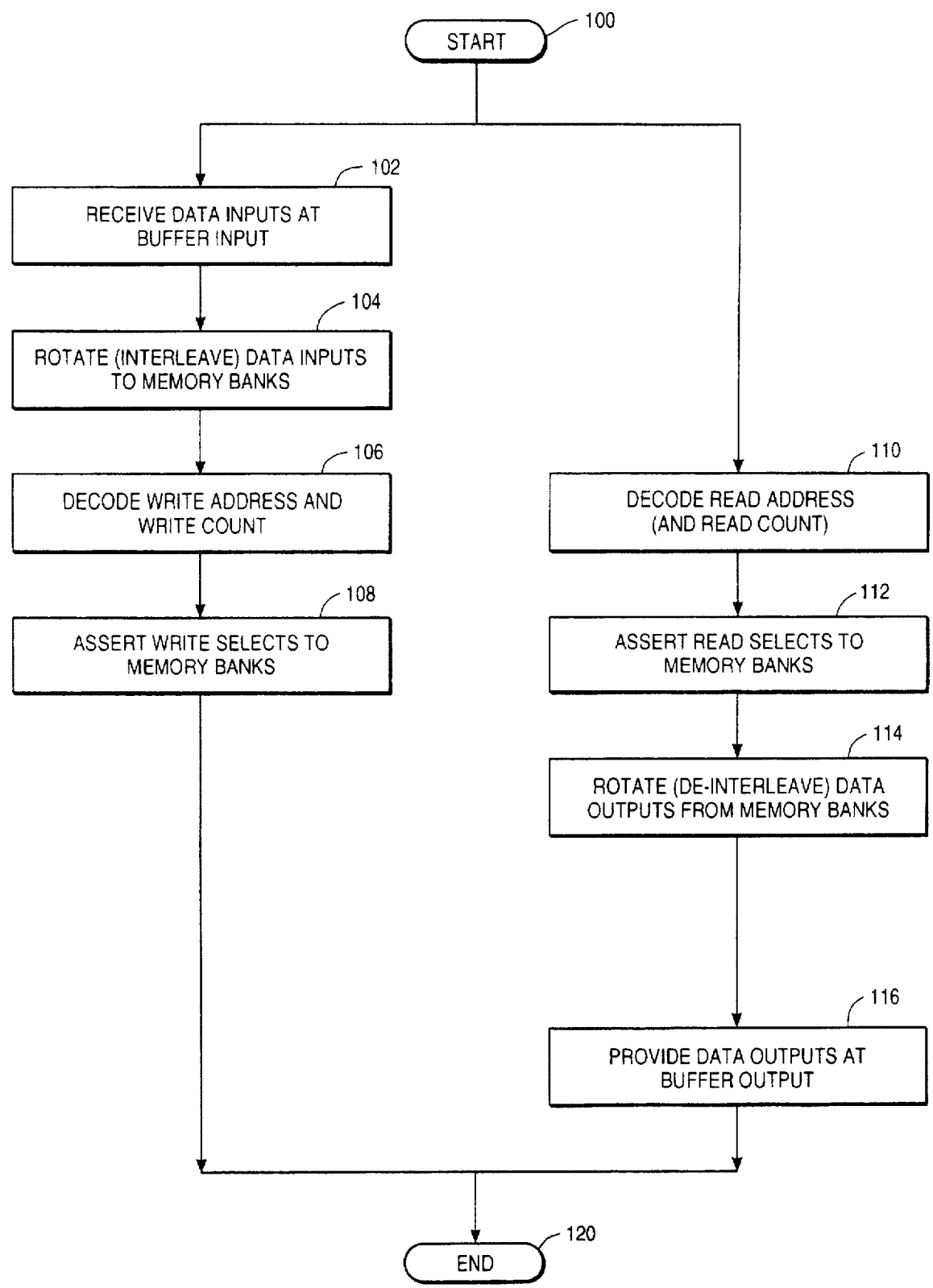
FIG_1

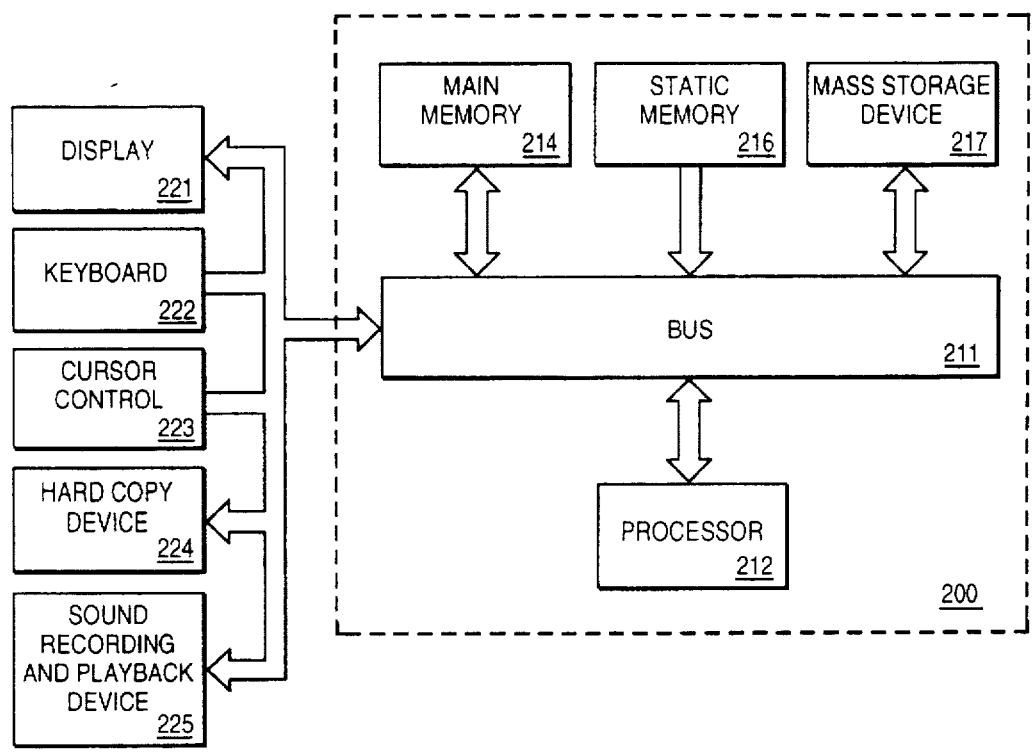
FIG_2A
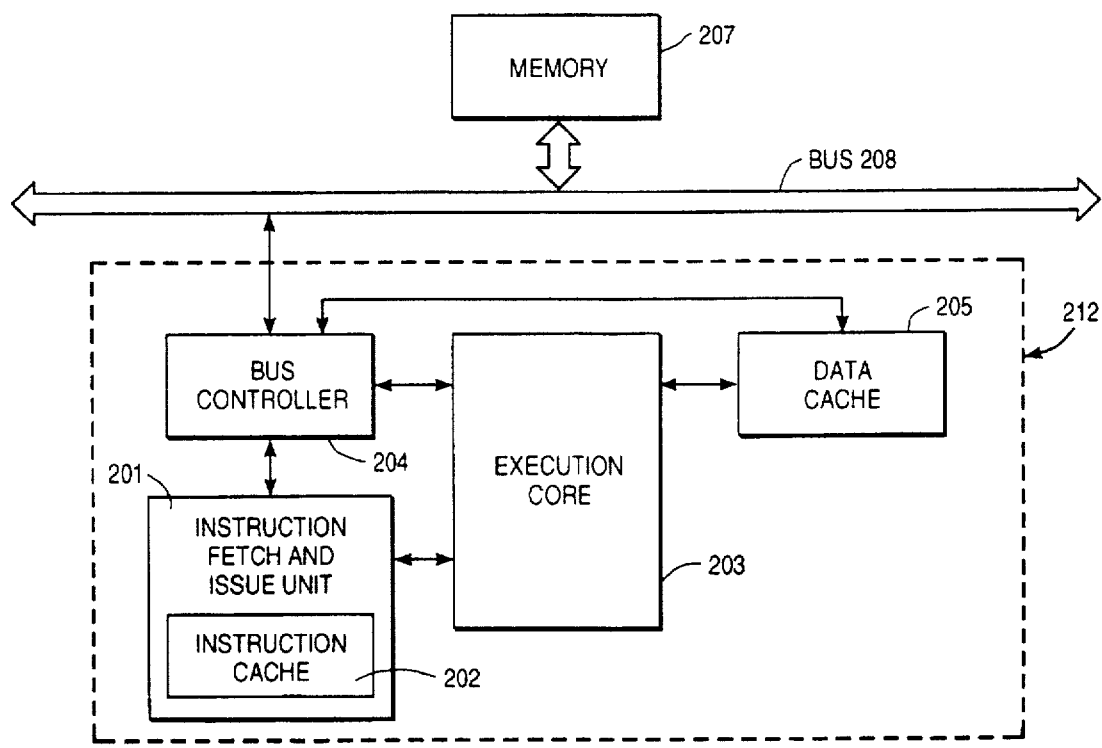
FIG_2B

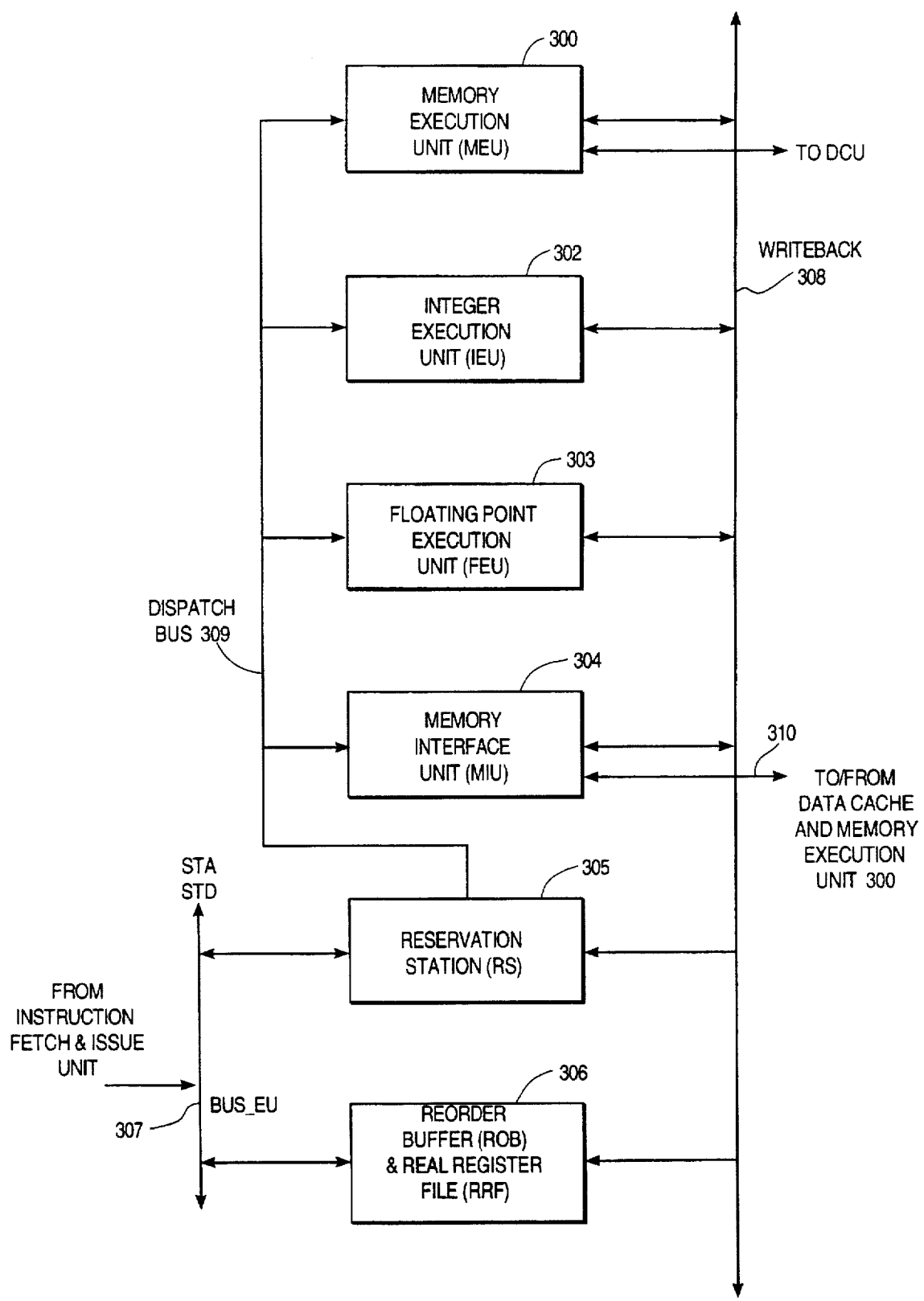
FIG_3

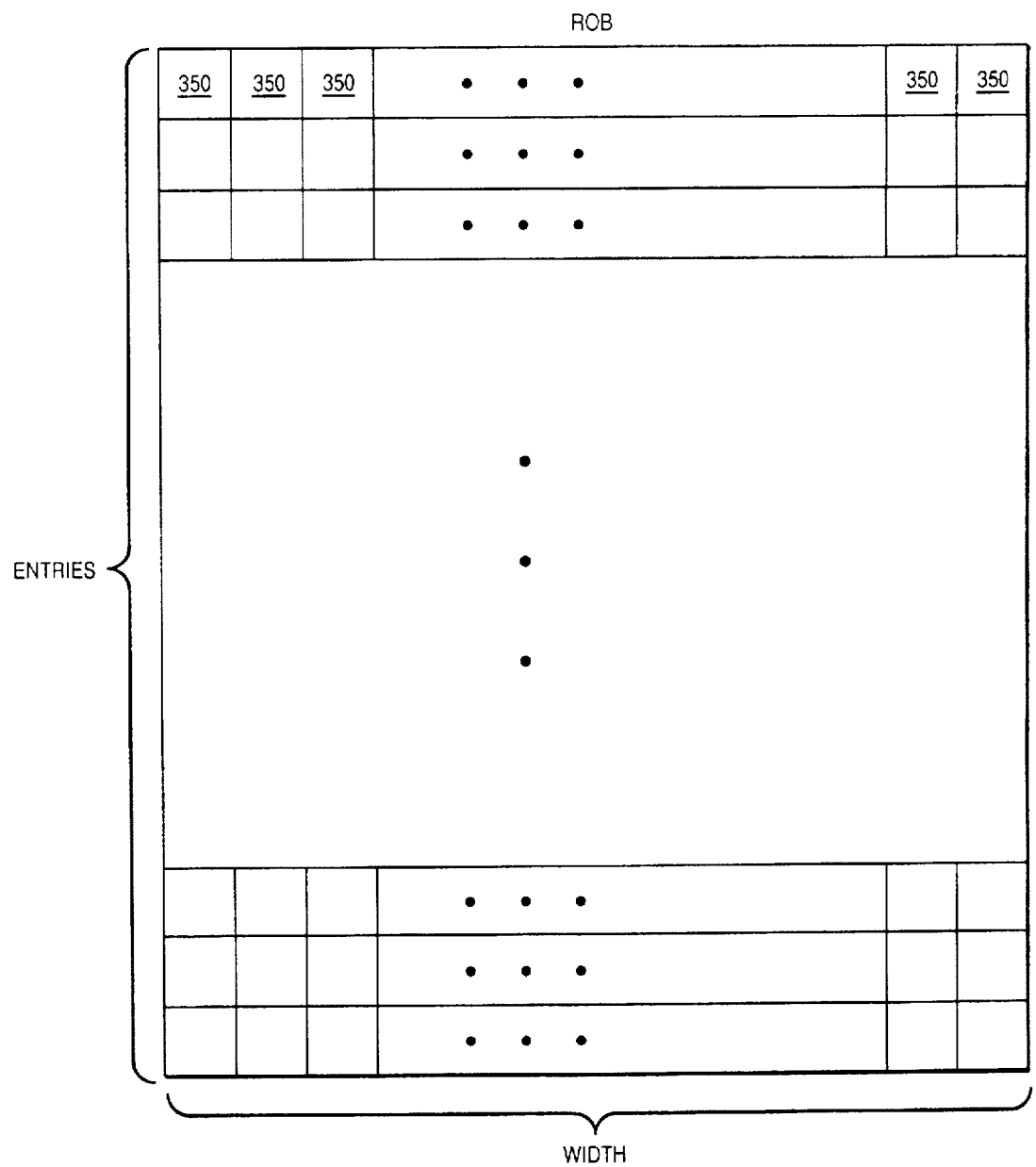
FIG_4

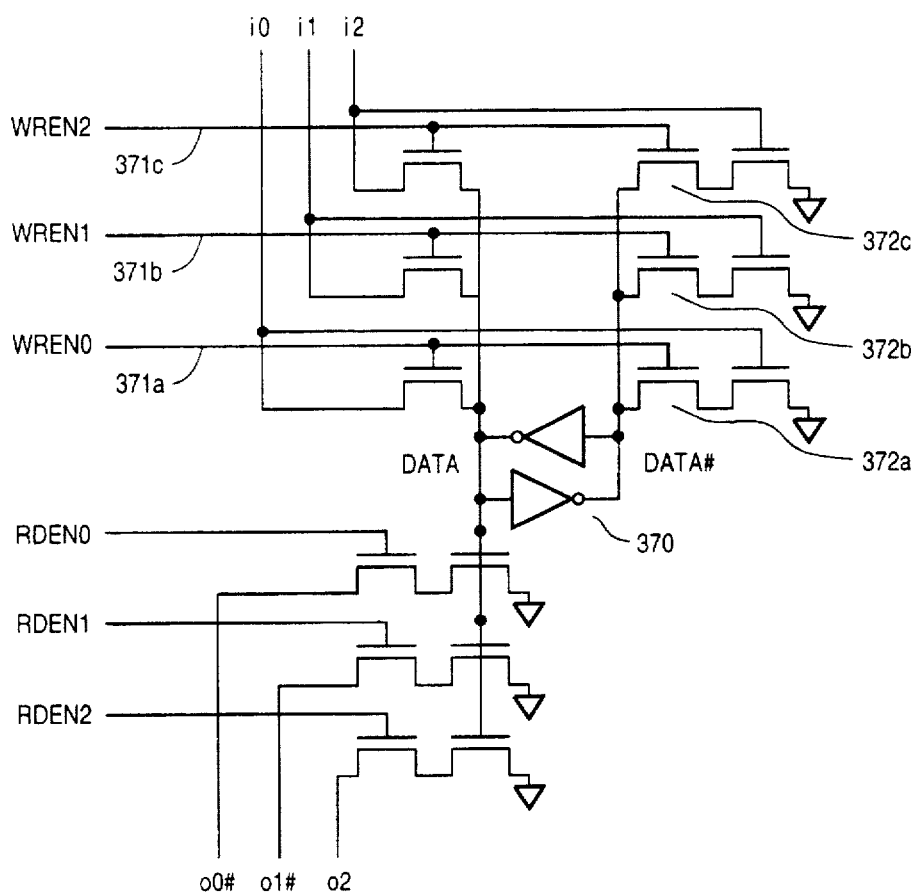
FIG_5
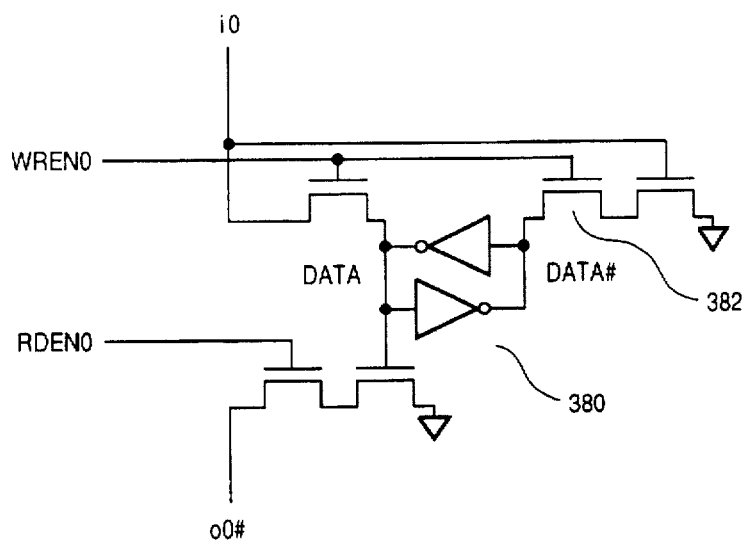
FIG_6

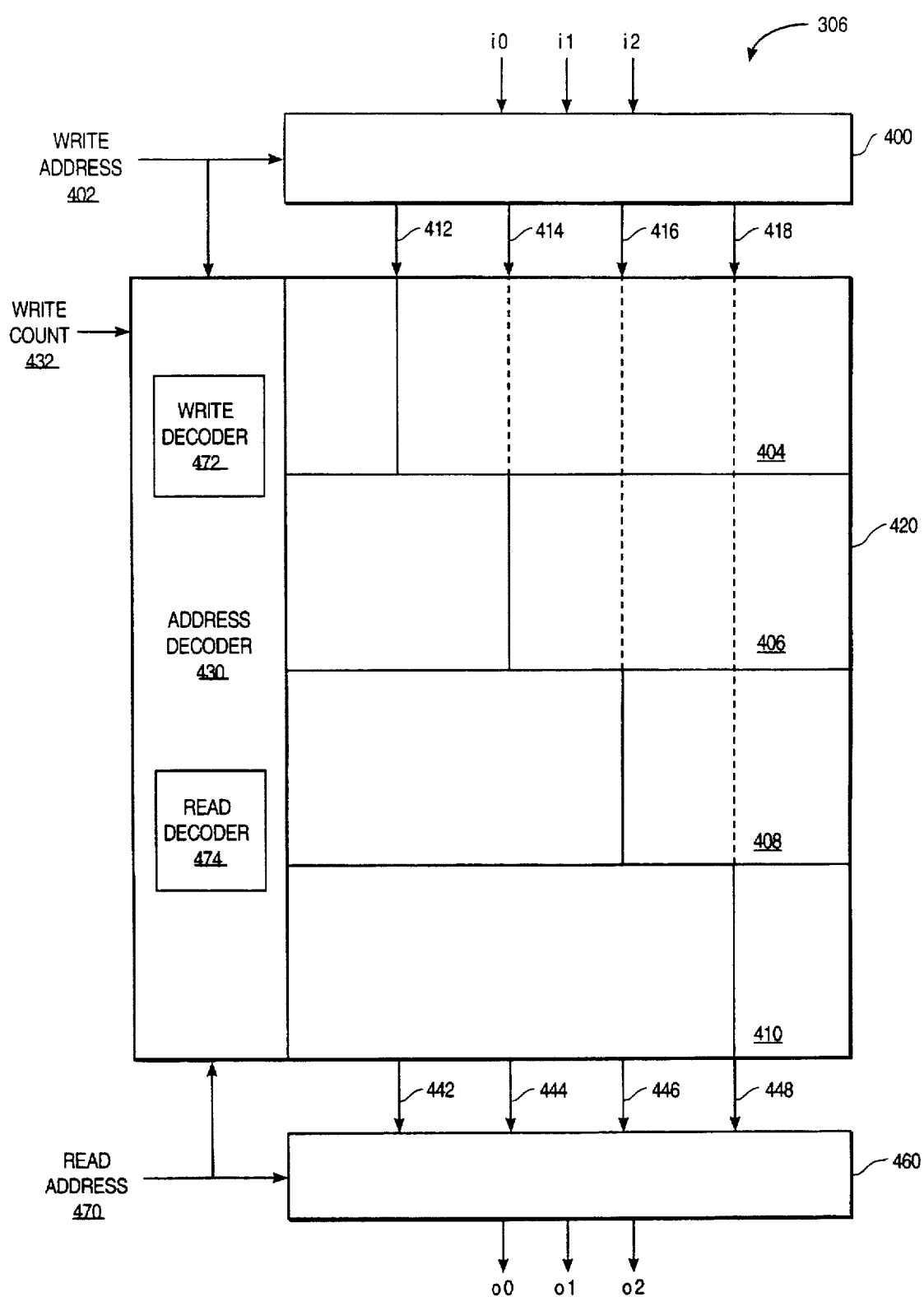
FIG_7

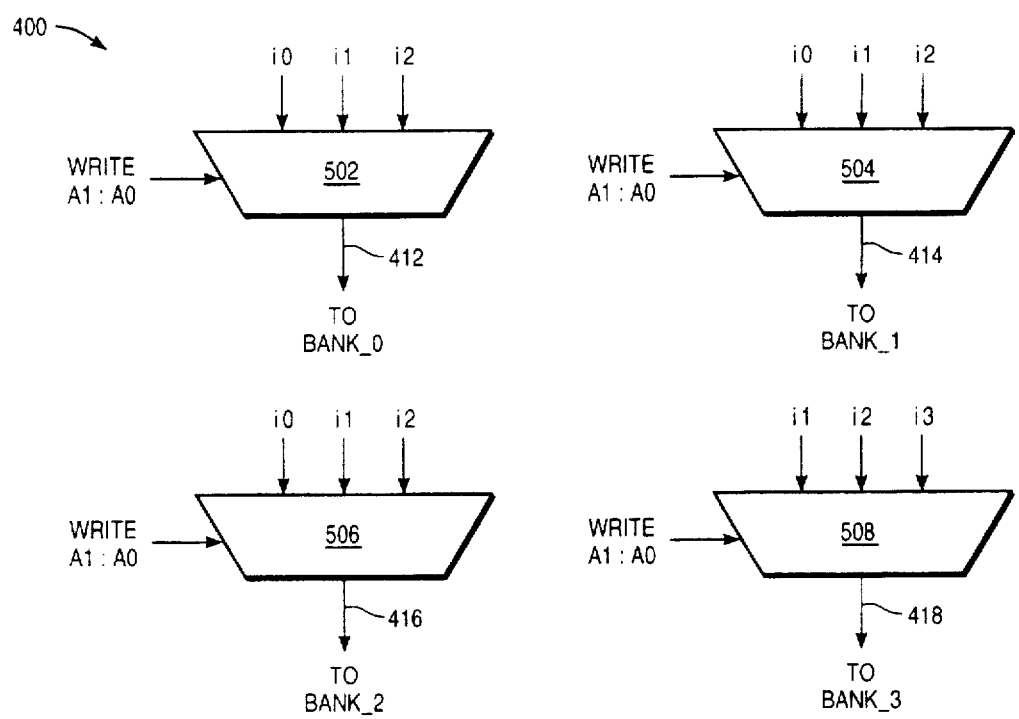
FIG_8
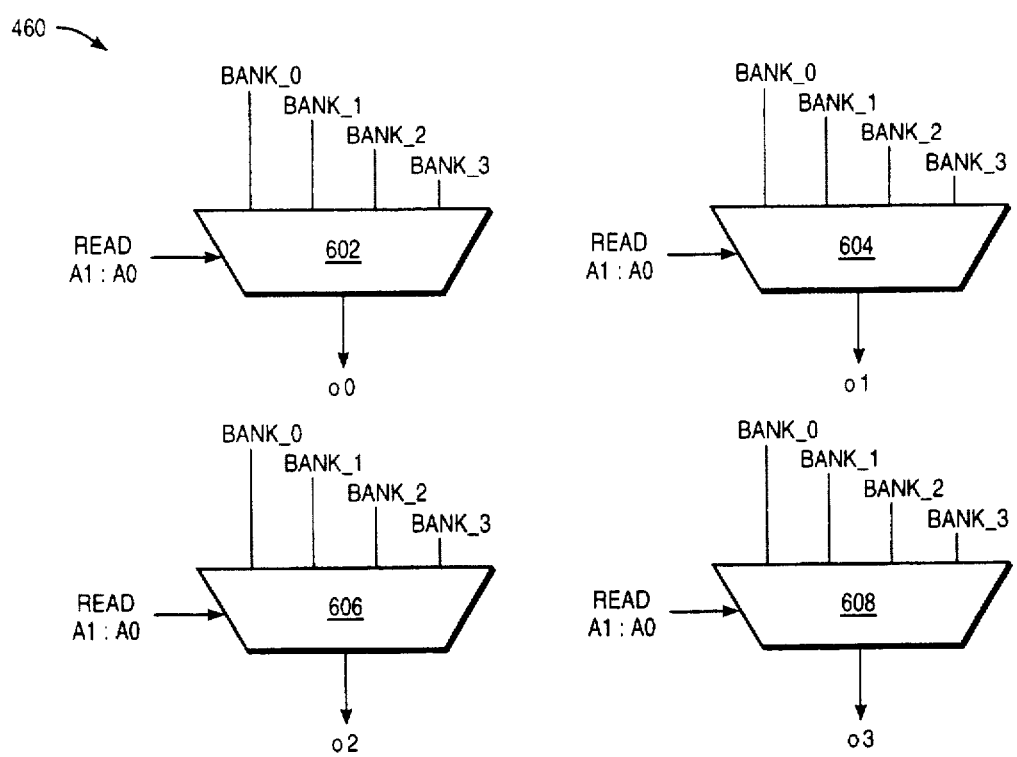
FIG_9

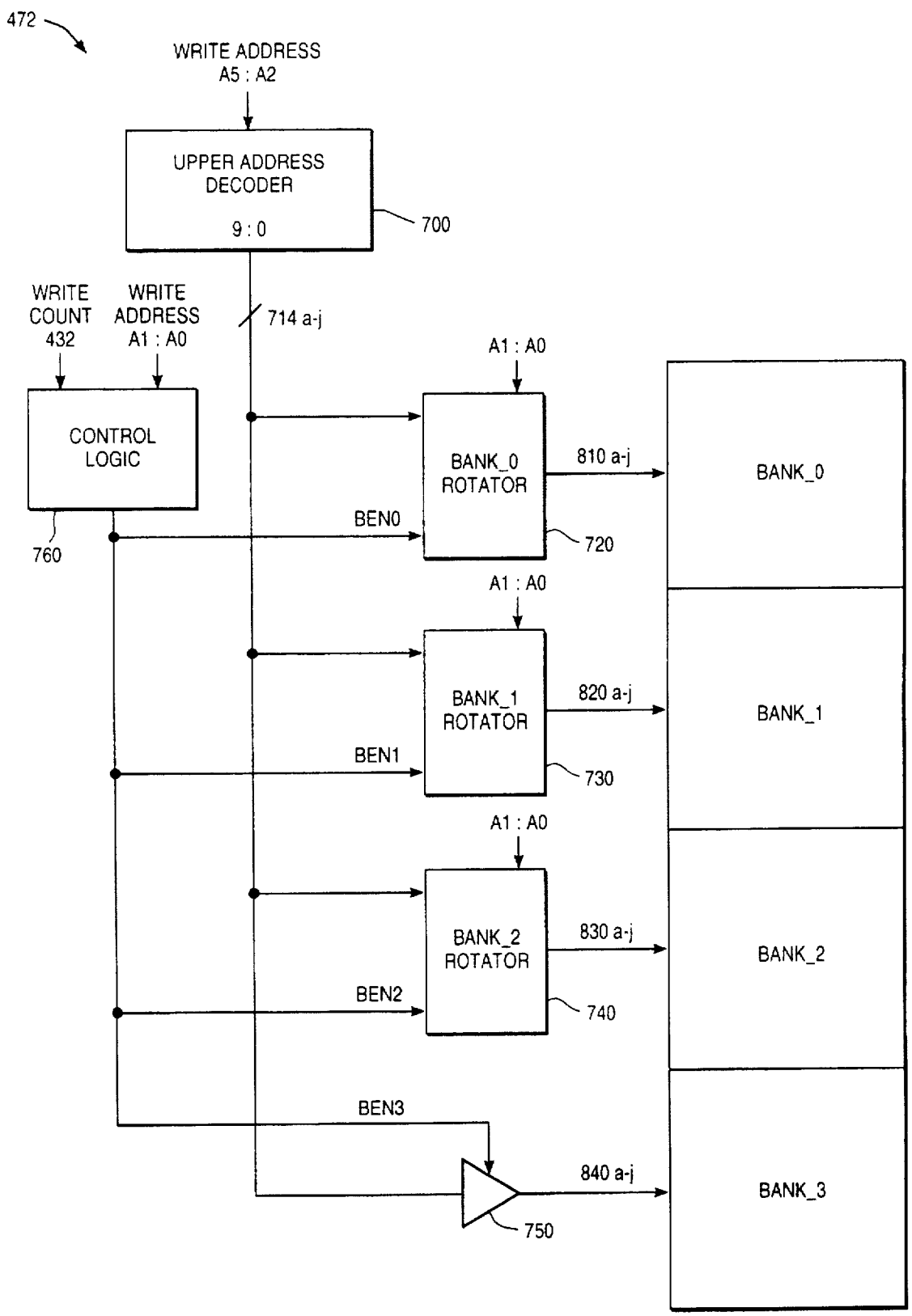
FIG_10

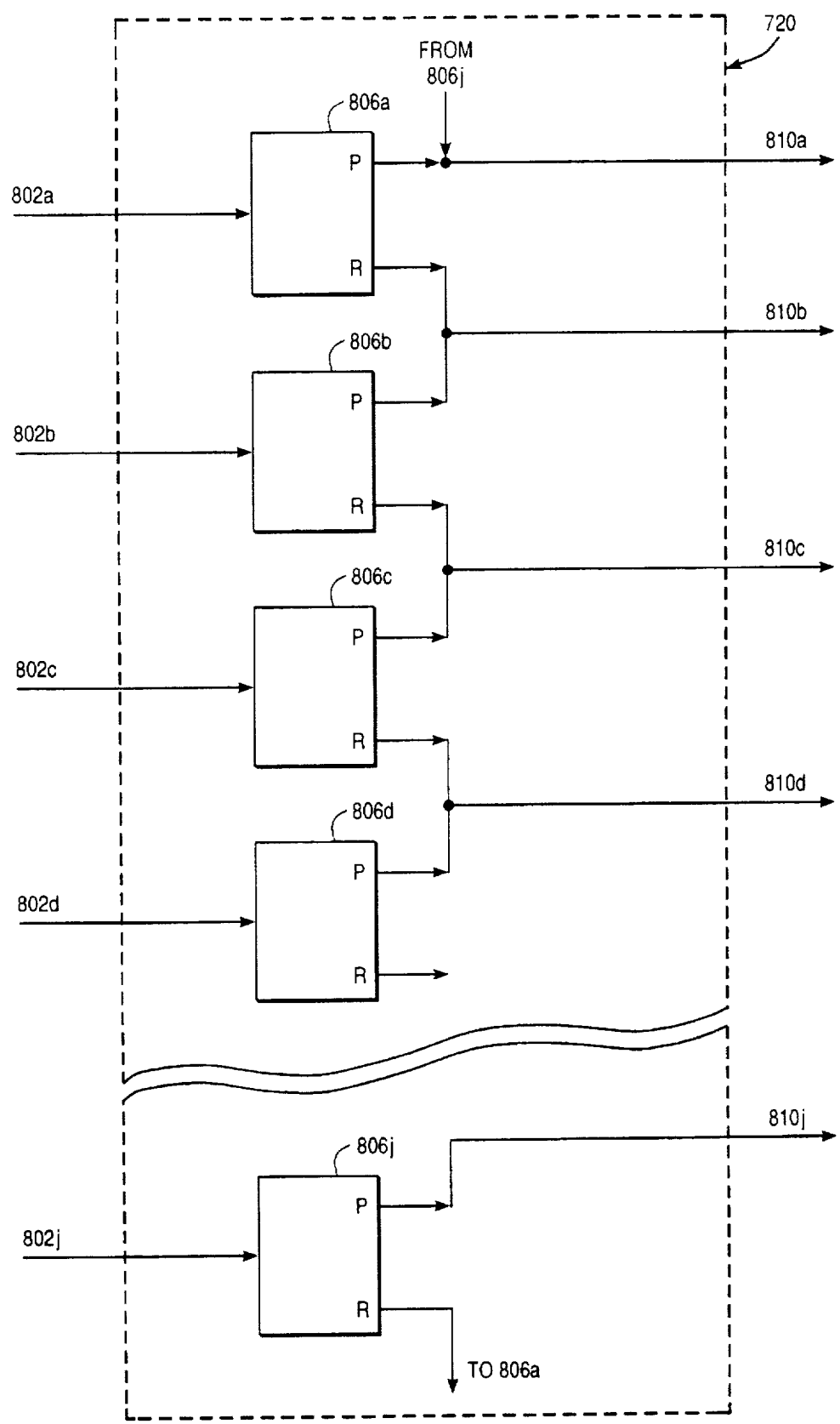
FIG_11

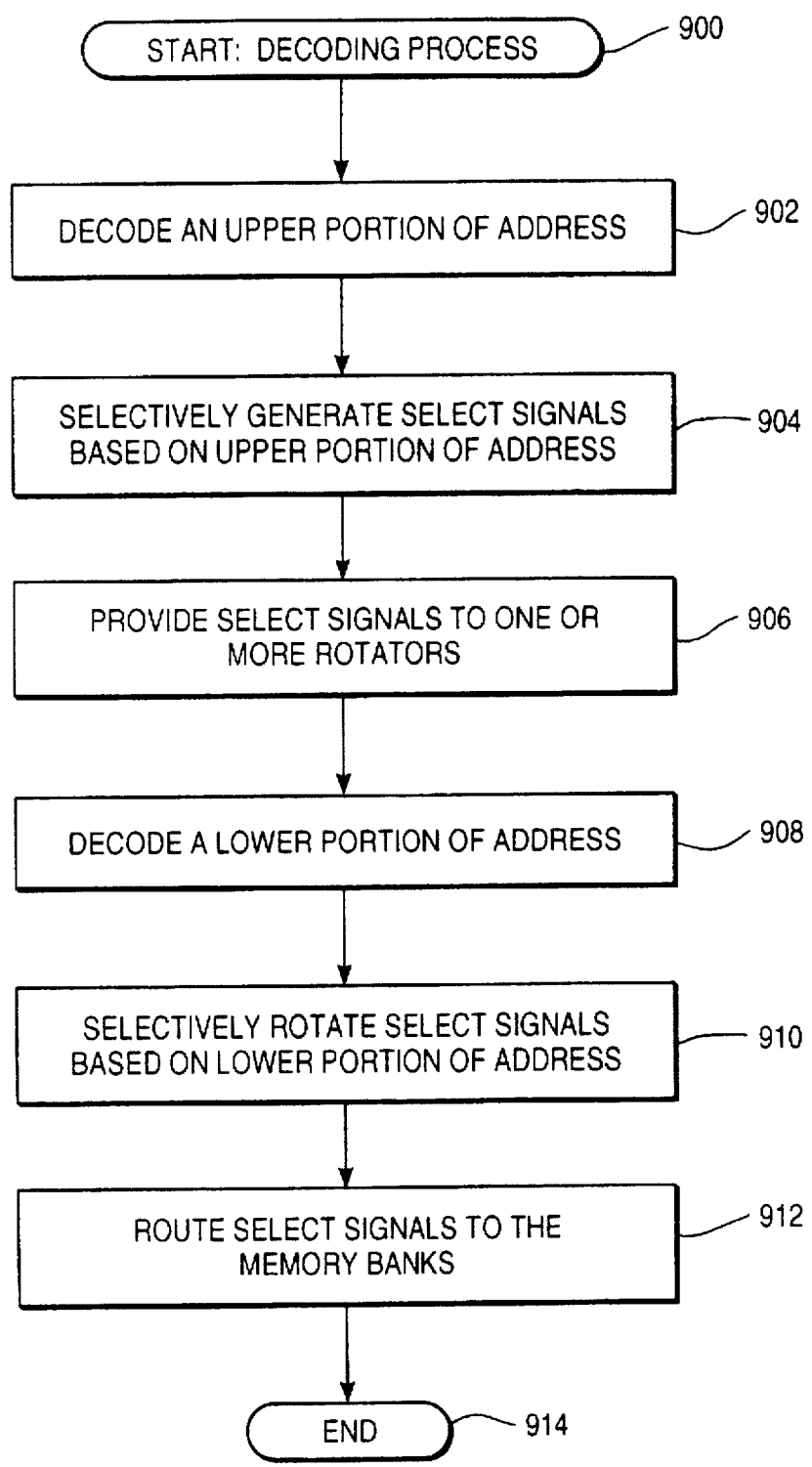
FIG_12

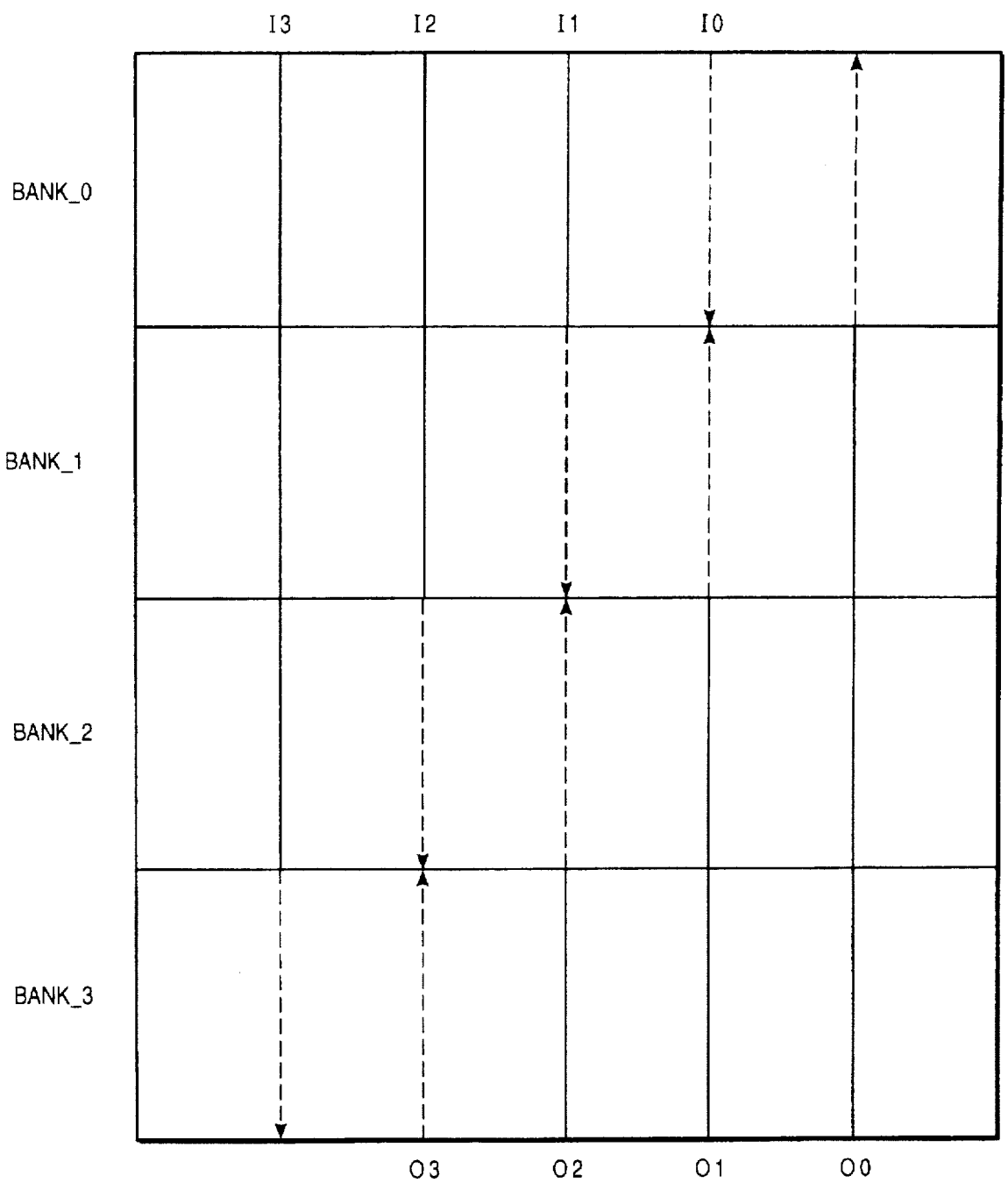
FIG_13

RECORDER BUFFER WITH INTERLEAVING MECHANISM FOR ACCESSING A MULTI-PARTED CIRCULAR MEMORY ARRAY

FIELD OF THE INVENTION

The present invention relates to the field of memory arrays; more particularly, the present invention relates to addressing multi-ported circular memory arrays. These multi-ported circular memory arrays have a wide variety of uses. One use is as a data buffer in a processor.

BACKGROUND OF THE INVENTION

A memory array is an array of memory cells. Each memory cell stores one bit of data. The memory cells can be combined to store a set of data. An address is used to store the set of data to a particular location in the memory array. The set of data can be retrieved from the memory array later by referencing the same address that was used to store the set of data.

A circular memory array is a memory array which wraps around upon itself. For example, if the memory array has ten entries, zero through nine, then after address nine is allocated, the next address to be allocated is address 0. Similarly, after retiring (i.e., deallocating) address 0, the next sequential address to be retired is address 9. A pointer is often used to indicate the beginning of the circular array so that the array does not overwrite itself.

A multi-ported memory array is an array which allows multiple entries to be written at the same time, or multiple entries to be read from the array at the same time. Multi-ported memory arrays have a variety of different uses. For example, they can be used in register files, memory buffers, first-in first-out memory arrays, and so forth.

One application of a multi-ported memory array is in a processor of a computer system. A computer system may be divided into three basic blocks: a central processing unit (CPU), memory, and input/output (I/O) units. These blocks are coupled to each other by a bus. An input device, such as a keyboard, mouse, stylus, analog-to-digital converter, etc., is used to input instructions and data into the computer system via an I/O unit. These instructions and data can be stored in memory. The CPU receives the data stored in the memory and processes the data as directed by a set of instructions. The results can be stored back into memory or outputted via the I/O unit to an output device, such as a printer, cathode-ray tube (CRT) display, digital-to-analog converter, etc.

Some computer systems have the capabilities to execute instructions out-of-order. In other words, the CPU in the computer system is capable of executing one instruction before a previously issued instruction. This out-of-order execution is permitted because there is no dependency between the two instructions. That is, the subsequently issued instruction does not rely on a previously issued unexecuted instruction for its resulting data or its implemented result. The CPU may also be capable of executing instructions speculatively, wherein conditional branch instructions may cause certain instructions to be fetched and issued based on a prediction of the condition. Therefore, depending on whether the CPU predicted correctly, the CPU will be either executing the correct instructions or not. Branch prediction and its relationship with speculative execution of instructions is well-known in the art. Speculative and out-of-order execution offer advantages over the prior art, including better use of resources. If multiple instructions are permitted to be executed at the same time, this performance benefit greatly increases. For a detailed explanation of speculative out-of-order execution, see M. Johnson, *Superscalor Microprocessor Design*, Prentice Hall, 1991.

Additionally, pipelining is used to speed up the execution of the processor. By employing pipelining, while one instruction is executing, one or more other instructions are initiated such that multiple instructions are processed concurrently. For example, each instruction takes three cycles to complete. A first instruction may be started in the first cycle. A second instruction may be started in the second cycle, and a third instruction may be started in the third cycle, and so forth. Barring any irregularities, the first instruction will finish in the third cycle. The second instruction will finish in the fourth cycle, and the third instruction will finish in the fifth cycle. Pipelining affords much more efficient usage of the processor than if the instructions were performed serially.

SUMMARY OF THE INVENTION

The present invention covers a reorder buffer for use in an out-of-order processor. The reorder buffer has a predetermined number of data inputs and a predetermined number of data outputs, and comprises an array of memory cells. The memory cells in the array are organized in an arrangement wherein each of the cells is coupled to read and write bitlines. The array has an interleaved design, with the read bitlines and the write bitlines being shared among a set of discontinuous metal tracks. In addition, the memory cells are grouped into a plurality of memory banks, the memory banks having a plurality of outputs. Each of the memory cells has a single write port and a single read port, and each is accessed in a circular order.

The reorder buffer further includes an interleavor that routes the predetermined number of data inputs to the memory banks. A first decoder is coupled to receive a write address and a write count signal. From the write address and write count signal, the first decoder provides a plurality of write enable signals to the memory banks. Also, from a read address, a second decoder provides a plurality of read enable signals to the memory banks. A de-interleavor routes the plurality of outputs from the memory banks to the predetermined number of data outputs of the reorder buffer.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1 is a flow diagram illustrating the process of the present invention.

FIG. 2A is a block diagram of the computer system of the present invention.

FIG. 2B is a block diagram of the memory subsystem of the present invention.

FIG. 3 is a block diagram of one embodiment of the execution unit of a processor.

FIG. 4 shows a block diagram of one embodiment of the Re-Order Buffer (ROB).

FIG. 5 shows a memory cell which does not use the present invention.

FIG. 6 shows a memory cell which uses the present invention.

FIG. 7 shows a block diagram of the ROB using the present invention.

FIG. 8 shows one embodiment of the interleavor.

FIG. 9 shows one embodiment of the de-interleavor.

FIG. 10 shows an embodiment of an address decoder utilizing a single address input.

FIG. 11 shows a diagram of a rotator of an address decoder.

FIG. 12 shows a flow diagram of the steps taken by the write decoder and the read decoder in decoding an address and generating a select signal.

FIG. 13 shows a view of bitlines of the memory array.

DETAILED DESCRIPTION OF THE PRESENT INVENTION

A method and apparatus for address decoding for accessing a multi-ported circular memory array is described. In the following detailed description of the present invention numerous specific details are set forth in order to provide a thorough understanding of the present invention. However, it will be obvious to one skilled in the art that the present invention may be practiced without these specific details.

Overview of the Present Invention

The present invention includes a process and mechanism for address decoding for accessing a multi-ported, circular memory array.

FIG. 1 shows a flow diagram indicating the steps taken in accessing a buffer including the multi-ported, circular memory array of the present invention. The buffer allows up to a predetermined number of data inputs to be written to the memory array each clock cycle. The buffer also allows up to a predetermined number of data outputs to be retrieved from the memory array each clock cycle. The data inputs may or may not overlap with the data outputs depending upon the embodiment. The process of writing to the memory array and reading from the memory array are independent of each other and operate concurrently as is shown in the flow diagram.

The flow diagram starts at block 100, which proceeds at block 102 and at block 110. The process of writing to the memory array starts with block 102, at which data inputs are received from a buffer input. From the block 102, operation continues at block 104, at which the data inputs are interleaved to different memory banks of the memory array. The flow diagram continues at block 106, at which a write address and a write count are decoded. From block 106, the flow diagram proceeds to block 108, at which write selects are provided to the memory banks resulting in the storage of the data inputs. From block 108, the flow diagram proceeds to block 120 at which the flow diagram terminates.

The process of reading from the memory array starts with block 110, at which a read address is decoded. From block 110, operation proceeds to block 112, at which read selects are asserted to the memory banks of the memory array. The flow diagram proceeds at block 114 at which the data outputs from the memory banks responsive to the read selects are re-assembled. In one embodiment, a read count is used to disable reads of certain data outputs if not all of the predetermined number of data outputs are valid. In another embodiment, invalid data is simply ignored. The flow diagram continues at block 116, at which the data outputs are provided at a buffer output. From block 116, the flow diagram proceeds to block 120 at which the flow diagram terminates.

Overview of the Computer System of the Present Invention

Referring to FIG. 2A, the computer system upon which one embodiment of the present invention is implemented is shown as 200. Computer system 200 comprises a bus or other communication device 211 for communicating information, and a processing device 212 coupled with bus 211 for processing information. Processor 212 includes, but is not limited to microprocessors such as an Intel Architecture Microprocessor, manufactured by Intel Corporation of Santa Clara, Calif., the corporate assignee of the present invention. Processor 212 may also be another microprocessor such as the PowerPC™, Alpha™, etc. System 200 further comprises a random access memory (RAM) or other dynamic storage device 214 (referred to as main memory), coupled to bus 211 for storing information and instructions to be executed by processor 212. Main memory 214 also may be used for storing temporary variables or other intermediate information during execution of instructions by processor 212. Computer system 200 also comprises a read only memory (ROM) and/or other static storage device 216 coupled to bus 211 for storing static information and instructions for processor 212, and a data storage device 217 such as a magnetic disk or optical disk and its corresponding disk drive. Data storage device 217 is coupled to bus 211 for storing information and instructions.

Computer system 200 may further be coupled to a display device 221, such as a cathode ray tube (CRT) or liquid crystal display (LCD) coupled to bus 211 for displaying information to a computer user. An alphanumeric input device 222, including alphanumeric and other keys, may also be coupled to bus 211 for communicating information and command selections to processor 212. An additional user input device is cursor control 223, such as a mouse, a trackball, stylus, or cursor direction keys, coupled to bus 211 for communicating direction information and command selections to processor 212, and for controlling cursor movement on display 221. Another device which may be coupled to bus 211 is hard copy device 224 which may be used for printing instructions, data, or other information on a medium such as paper, film, or similar types of media. Furthermore, a sound recording and playback device, such as a speaker and microphone may optionally be coupled to bus 211 for interfacing with computer system 200. Note that any or all of the components of system 200 and associated hardware may be used in a preferred embodiment, however, it can be appreciated that any type of configuration of the system may be used for various purposes as the user requires.

FIG. 2B is a block diagram of the memory subsystem of the computer system of the present invention. Referring to FIG. 2B, the memory subsystem comprises an instruction fetch and issue unit 201 with an integrated instruction cache 202, an execution core 203, a bus controller 204, a data cache memory 205, a memory unit 207, and a bus 208.

The memory unit 207 is coupled to the system bus. The bus controller 204 is coupled to the bus 208. The bus controller 204 is also coupled to the data cache memory 205 and the instruction fetch and issue unit 201. The instruction fetch and issue unit 201 is also coupled to the execution core 203. The execution core 203 is also coupled to the data cache memory 205. In the present invention, the instruction fetch and issue unit 201, the execution core 203, the bus controller 204, and the data cache memory 205 together comprise the processor 212 (FIG. 2A). In the present invention, elements 201–205 cooperate to fetch, issue, execute and save the execution results of instructions in a pipelined manner.

The instruction fetch and issue unit 201 fetches instructions from an external memory, such as memory unit 207, through the bus controller 204 via bus 208, or any other external bus. The fetched instructions are stored in instruction cache 202. The bus controller 204 manages transfers of data between external components and the processor 102. In addition, it manages cache coherency transfers. The instruction fetch and issue unit 201 issues these instructions in-order to the execution core 203. The execution core 203 performs arithmetic and logic operations, such functions as add, subtract, logical AND, and integer multiply, as well as memory operations. Some instructions are fetched and issued speculatively.

The execution core 203 includes an execution unit that holds and executes the integer and floating point instructions when their operand dependencies on execution results of preceding instructions are resolved, including those integer and floating point instructions that are speculatively fetched and issued. Similarly, the execution core 203 also includes a memory execution unit that holds, executes and dispatches load and store instructions to the data cache memory 205 (as well as external memory) as soon as their operand dependencies on execution results of preceding instructions are resolved, including those load and store instructions that are speculatively fetched and issued.

Instruction fetch and issue unit 201 is intended to represent a broad category of instruction fetching and issuing elements found in many computer systems. Their constitutions and functions are well-known and will be described only as necessary with reference to later figures.

The bus controller 204, the bus 208, and the memory 207 are also intended to represent a broad category of these elements found in most computer systems. Their functions and constitutions are well-known and will not be described further. The execution core 203, incorporating with the teachings of the present invention, and the data cache memory 205 will be described further in detail below with additional references to the remaining figures.

FIG. 3 is a block diagram of one embodiment of the execution core of a processor. Referring to FIG. 3, execution core 203 comprises a reservation station (RS) 305, a memory execution unit MEU 300, an integer execution unit (IEU) 302, a floating point execution unit (FEU) 303, a memory interface unit (MIU) 304, a reorder buffer (ROB) and real register file (RRF) 306. Additionally, execution core 203 includes an internal bus (Bus_EU) 307 and a writeback bus 308. MEU 300, an address generation unit (AGU) 301 (shown in FIG. 5), IEU 302, FEU 303 and MIU 304 are all coupled to reservation station 305 via a dispatch bus 309. They are also coupled to writeback bus 308. MIU 304 is also coupled to the data cache memory and MEU 300 via bus 310. RS 305 is coupled to the writeback bus 308 and the Bus_EU 307. RS 305 is also coupled to ROB and RRF 306. ROB and RRF 306 is also coupled to the Bus_EU 307 and the writeback bus 308. Together, elements 300–310 are coupled to hold, dispatch, execute and commit execution results of instructions, whereas described earlier, the dispatching and execution of instructions are not necessarily in the order the instructions are issued. That is, the instructions could be dispatched and executed out-of-order. Execution core 203 may include multiple IEUs, such as two, and multiple FEUs, such as two.

Reservation station 305 receives and stores the issued instructions resolving their operands with data from the IEU 302, the FEU 303, the data cache memory, the ROB and RRF 306 and holds them until their operands are all resolved. The RS 305 then dispatches the issued instructions to the AGU 301, the IEU 302, the FEU 303 and the MIU 304 and the MEU 300 as appropriate.

In particular, the load instruction is dispatched as a single operation, whereas the store instruction is dispatched as store address (STA) and stored data (STD) operations to the MEU 300 and MIU 304. Similar to instruction fetching, there is no requirement that the load sources or the store destinations be aligned to memory locations. In other words, the load sources of load instructions and store destinations of store instructions may span two cache lines (or two pages).

The MEU 300, the IEU 302, FEU 303, and the MIU 304 in turn perform their operations accordingly. The execution results of the integer, floating point and load instructions are held in the ROB 306, and then committed by RRF 306 in the order these instructions were issued. Speculative execution results of the mispredicted branches are not committed, but instead are held in the ROB 306 and purged upon their detection. Updating the state of the processor including updating the RRF in response to the execution of an operation is referred to as retirement.

FIG. 4 shows a block diagram of one embodiment of the ROB 306. The ROB is comprised of a plurality of memory cells 350. The memory cells provide storage for a number of entries in the ROB. Each entry comprises a number of memory cells which make up the width of the entry. In one representative embodiment, the ROB includes 40 entries, and each of the entries comprises 54 memory cells.

Each entry of the ROB 306 stores information about a pending operation. This information includes such data fields as opcode and status bits. The status bits may include valid bits, parity bits, and so forth.

FIG. 5 shows a memory cell of an N-type device which does not use the present invention. Each memory cell of the ROB 306 has an input from three data inputs—i0, i1, and i2. Any one of the three data inputs can be written to a storage cell 370 upon assertion of the corresponding one of three write enables wren0, wren1, or wren2 371a–c. In one embodiment, each of the write enables 371a–c is coupled to an assisting transistor 372a–c. The assisting transistors 372a–c provide assistance when writing a logical '1' to the storage cell since, for N-type devices, it is more difficult to write a logical '1' to the storage cell, than to write a logical '0' to the storage cell, as is well-known in the field. In another embodiment, a P-type device could be employed instead of an N-type device.

Similarly, FIG. 5 shows three data outputs o0, o1, and o2. Assertion of any one of the read enables rden0, rden1, or rden2 provides the inverted value of the storage cell 370 on the corresponding data output.

FIG. 6 shows a memory cell of an N-type device which uses the present invention. Each memory cell of the ROB 306 has only one write enable wren0 and one read enable rden0. The write enable wren0 allows storage of the data input i0 to the storage cell 380. An assisting transistor 382 provides assistance when writing a logical '1' to the storage cell 380, as explained above. The read enable rden0 allows the data stored in the storage cell 380 to be read from the data output o0.

The memory cell of FIG. 6 has one allocation write port and one retirement read port, wherein the allocation write port comprises write data and a write enable coupled to a storage cell, and the retirement read port comprises read data and a read enable coupled to a storage cell. The memory cell of FIG. 5, in comparison, has three allocation write ports and three retirement read ports.

A considerable savings in die real estate is achieved from the memory cell of FIG. 5. For example, there is a savings of 10 transistors per memory cell over the memory cell of FIG. 5. This is significant when the savings per memory cell is multiplied by the number of entries in the ROB and by the width of each entry of the ROB.

It should be noted that additional read ports and additional write ports could be added to the memory cell of FIG. 6 for accessing the cell in a manner different from the sequential and circular manner described for the present invention. For example, additional ports could be added for randomly accessing the memory cells.

FIG. 7 shows a block diagram of a ROB 306 using the present invention. In the embodiment shown in FIG. 7, the ROB 306 includes an order-3 memory array: data from up to three operations are written into the ROB in a clock cycle, and the ROB retires up to three operations in a clock cycle. In another embodiment, the ROB is an order-4 memory array, in which case, up to four operations are written to the ROB and up to four operations are retired from the ROB during a clock cycle.

The order-3 ROB 306 has three data inputs i0, i1, and i2, which are provided to an interleavor 400. The data inputs i0, i1, and i2 correspond to data from three currently executing operations. In the representative embodiment, each data input is 54 bits wide. A write address 402 is an input to the interleavor 400.

The memory array is comprised of a plurality of memory banks. In one embodiment, the memory array is made up of four memory banks: Bank_0 404, Bank_1 406, Bank_2 408, and Bank_3 410. The interleavor 400 provides a data input 412, 414, 416, and 418 to each of the memory banks of the memory array 420. The interleavor 400 provides the data input 412 to Bank_0; the interleavor 400 provides the data input 414 to Bank_1, the interleavor 400 provides the data input 416 to Bank_2, and interleavor 400 provides the data input 418 to Bank_3.

In the representative embodiment, each of the four memory banks includes 10 entries: Bank_0 includes entries 0, 4, 8, 12, . . . 36; Bank_1 includes entries 1, 5, 9, 13, . . . 37; Bank_2 includes entries 2, 6, 10, 14, . . . 38; Bank_3 includes entries 3, 7, 11, 15, . . . 39.

A decoder 430 is coupled to the memory array 420. The decoder receives an input from the write address 402. The decoder also receives an input from a write count signal 432. The write count signal 432 indicates to the decoder how many of the data inputs are to actually be written to the memory array. For example, the write count signal 432 indicates if less than all of the data inputs are to be written to the ROB 306, due to an interrupt or other fault.

In one embodiment, the write count signal 432 is comprised of individual write enable signals, each of which corresponds to an operation and indicates whether that corresponding operation is valid. In one embodiment, there are three write enables signals WE[2:0]The write enable signals are progressive such that the second write enable WE[1] can only be asserted if the first write enable WE[0] is asserted, and the third write enable WE[2] can only be asserted if both the second write enable WE[1] and the first write enable WE[0] are asserted. In one embodiment, the write enables signals originate from status bits within the data inputs i0, i1, and i2 of the corresponding operation indicating that the operation is valid.

The memory array 420 provides one data output from each memory bank of the memory array 420. Thus, in the representative embodiment, there are four data outputs provided to the interleavor 460: the data output 442 is provided from Bank_0; the data output 444 is provided from Bank_1; the data output 446 is provided from Bank_2; the data output 448 is provided from Bank_3.

A read address signal 470 is provided as an input to both the decoder 430 and the de-interleavor 460. The de-interleavor provides the three output signals o0, o1, and o2 which correspond to the three operations that the order-3 ROB retires during each cycle. In some cases, three operations are not able to be retired during the same cycle. Zero, one or two operations are retired instead. Thus, sometimes one or more of the output signals o0, o1, and o2 are ignored. In one embodiment, all three ROB entries are provided as an output regardless of whether all three are valid. In another embodiment, only valid data is read in order to conserve power.

Since the data inputs i0, i1, and i2 of the ROB, correspond to operations currently pending in the processor, and the data outputs o0, o1, and o2 of the ROB correspond to operations which are retired from the ROB upon completion and updating of the register state of the processor, it is very important that an accurate pointer is maintained which keeps track of the allocation and the retirement of operations. A write counter and a read counter are maintained. The write counter maintains the write address. It makes adjustments to the write address based upon the write count signal to keep track of the address of the last operation allocated to the ROB. In one embodiment, the write counter is located outside of the ROB, where it has better access to interrupt and fault information which may prevent the allocation of an operation. However, in another embodiment, the write counter could be maintained in the ROB.

Similarly, the read counter maintains the read address, and it makes adjustments based upon the number of operations which are retired from the ROB each cycle. In one embodiment the read counter is located within the ROB, since the ROB has access as to how many operations can be retired from it during the clock cycle. However, the read counter could be maintained outside the ROB.

In the representative order-3 buffer embodiment, a variable number of the data inputs i0, i1, and i2 are written to the ROB in each clock cycle. At the same time, a variable number of data outputs o0, o1, and o2 are retrieved from the ROB. Thus, at peak performance the processor is able to execute and retire three operations every clock cycle. In an order-4 buffer embodiment, at peak performance, the process is able to execute and retire four operations every clock cycle.

FIG. 8 shows one embodiment of the interleavor 400. The interleavor is comprised of four multiplexers, 502, 504, 506 and 508. Multiplexer 502 provides the data output signal 412 which is coupled to the Bank_0 of the ROB; multiplexer 504 provides the data output signal 414 which is coupled to the Bank_1 of the ROB; multiplexer 506 provides the data output signal 416 which is coupled to the Bank_2 of the ROB; multiplexer 508 provides the data output signal 418 which is coupled to the Bank_3 of the ROB.

Each multiplexer is coupled to receive the three input signals i0, i1, and i2. Each of the multiplexers is also coupled to receive the lowest two address signals A1 and A0 of the write address 402. However, each of the multiplexers provides a different output dependent upon the A1 and A0 inputs. Table 1, below, shows which data input is driven to which bank dependent upon the lowest two bits of the write address 402. For example, if the A1 and A0 inputs are both a logical '0', then the multiplexer 502 will provide the i0 input signal to Bank_0, the multiplexer 504 will provide the i1 input signal to Bank_1, and the mulitplexer 506 will provide the i2 input signal to Bank_2. Similarly, if the A1 signal is a logical '0' and the A0 signal is a logical '1', then the multiplexer 504 will provide the i0 input signal to Bank_1, the multiplexer 506 will provide the i1 input signal to Bank_2, and the mulitplexer 508 will provide the i2 input signal to Bank_3. A fourth entry i3 is also shown in parentheses. If the invention employed an order-4 buffer scheme instead of an order-3 buffer scheme, then the input signal i3 would be provided to the bank shown in Table 1.

TABLE 1

| Write (A1:A0) | BANK 0 | BANK 1 | BANK 2 | BANK 3 |
|---|---|---|---|---|
| 00 | i0 | i1 | i2 | (i3) |
| 01 | (i3) | i0 | i1 | i2 |
| 10 | i2 | (i3) | i0 | i1 |
| 11 | i1 | i2 | (i3) | i0 |

FIG. 9 shows one embodiment of the de-interleavor 460. The de-interleavor is comprised of four multiplexers (MUXs) 602, 604, 606, and 608. Each of the four multiplexers receives an input from each of the banks 402-410 of the memory array 420. Each of the four multiplexers also receives an input from the lowest two address bits of the read address signal 470. The multiplexers provide an output dependent upon the lowest two address bits of the read address 470.

Table 2, below, shows which data output is driven from which bank dependent upon the lowest two bits of the read address 470. For example, if A1 and A0 of the read address 470 are both a logical '0', then MUX 602 will provide the data from the first bank, Bank_0; MUX 604 will provide the data from the second bank, Bank_1; MUX 606 will provide the data from the third bank, Bank_2. Additionally, if this were an order-4 ROB, then MUX 608 would provide the data from the fourth bank, Bank_3. Thus, the multiplexers map data from the physical memory banks back to the logical operations.

TABLE 2

| Read (A1:A0) | MUX 602 | MUX 604 | MUX 606 | (MUX 608) |
|---|---|---|---|---|
| 00 | Bank_0 | Bank_1 | Bank_2 | (Bank_3) |
| 01 | Bank_1 | Bank_2 | Bank_3 | (Bank_0) |
| 10 | Bank_2 | Bank_3 | Bank_0 | (Bank_1) |
| 11 | Bank_3 | Bank_0 | Bank_1 | (Bank_2) |

The address decoder 430 is comprised of a write decoder 472 and a read decoder 474. In one embodiment, the write decoder is comprised of three decoders, each with a distinct address input for accessing any of the entries in the array. This embodiment requires three addresses 402 and the write count signal 432 and provides a simple decode on the write addresses to select the correct entries in the memory array.

Similarly, in one embodiment, the read decoder is comprised of three decoders, each of which receives a distinct read address and provides a simple decode to select the correct entry in the memory array. However, since decoders and the generation and distribution of distinct addresses take up a lot of real estate on the die, simplifying or eliminating one or more decoders is desired.

FIG. 10 shows one embodiment of the write address decoder 472 utilizing a single address input. An upper address decoder 700 receives an input from the upper portion of the write address 402. In one embodiment, the upper four bits of the write address 402 are coupled to the upper address decoder 700, and the upper address decoder is a 4-to-10 decoder that asserts a single active signal from its 10 output signals. For example, if the write address bits A5:A2 were all logical '0's, then the output 0 would be asserted.

Each of the ten outputs of the 4-to-10 decoder 700 are routed via signals 714a–j to three rotators 720, 730, and 740, and to a buffer 750. Rotator 720 provides address decoding for Bank_0 404; rotator 730 provides address decoding for Bank_1 406; rotator 740 provides address decoding for Bank_2 406; and buffer 750 provides address decoding for Bank_3 408.

Control logic 760 is coupled to provide a bank enable signal BEN3-0 to each of the rotators 720, 730, and 740 and the buffer 750 which provide data to the memory banks. Control logic receives the write count signal 432 and the lowest two bits of the write address 402 as inputs. The bank enables BEN3-0 prevents data from being stored to the memory arrays when the write count indicates that one or more of the data inputs is not valid.

Each of the rotators 720, 730 and 740 have an input from the lowest two bits of the write address 402. The upper address decoder 700 effectively selects an entry in each bank. However, for every bank except the last bank (Bank_3), the entry selection is passed through a rotator, which has the ability to either allow the entry selection to pass through or it will rotate the selection to the next consecutive entry.

The read decoder 474 is substantially the same as the write decoder 472, however, the read decoder receives the read address as an input instead of the write address. Additionally, the rotators of the read decoder need not be masked by bank enables, since this masking can be performed outside of the ROB.

FIG. 11 shows a diagram of the rotator 720. The rotator 720 has an input 802a–j from each of the outputs of the upper address decoder 700. Each of the inputs goes to a separate demultiplexer 806a–j. For example, input 802a goes to demultiplexer 806a, input 802b goes to demultiplexer 806b, and so forth.

Each of the demultiplexers have two outputs: a pass-through output and a rotated output. The rotated output of the first demultiplexer 806a is coupled with the pass-through output of the second demultiplexer 806b to provide an output signal 810b to the memory array 420. The rotated output of the second demultiplexer 806b is coupled with the pass-through output of the third demultiplexer 806c to provide an output signal 810c to the memory array 420. This pattern is repeated up to the last demultiplexer 806j. The rotated output of the last demultiplexer 806j is coupled to the pass-through output of the first demultiplexer 806a to provide an output signal 810a to the memory array 420.

Each of the demultiplexers 806a–j receive an input from the lowest two bits of the write address A1 and A0. Each demultiplexer within each rotator behaves the same way in response to the A1 and A0 input signals. For example, in rotator 720, each of the demultiplexers select between providing the pass-through output or the rotated output by performing an OR function on the A1 and A0 input signals.

Table 3 shows a set of demultiplexer functions used in the rotators 720, 730, and 740. Four sequential six bit addresses are shown to represent four examples of write address inputs to the address decoder of FIG. 11. Rotator 720, which is coupled to Bank_0, selects between its pass-through output and its rotated output by ORing the A1 and A0 inputs. Rotator 730, which is coupled to Bank_1, selects between its pass-through output and its rotated output by whether the A1 signal is a logical '1' or a logical '0'. Rotator 740, which is coupled to Bank_2, selects between its pass-through output and its rotated output by ANDing the A1 and A0 inputs.

TABLE 3

| ADDRESS | | ENTRY | | | | DEMULTIPLEXER FUNCTION | | | |
|---|---|---|---|---|---|---|---|---|---|
| | A1, A0 | Bank 0 | Bank 1 | Bank 2 | Bank 3 | Bank_0 (A1 OR A0) | Bank_1 (A1) | Bank_2 (A1 AND A0) | Bank_3 — |
| 0000 | 00 | 0 | 1 | 2 | (3) | pass (0) | pass (0) | pass (0) | pass (0) |
| 0000 | 01 | (4) | 1 | 2 | 3 | rotated (1) | pass (0) | pass (0) | pass (0) |
| 0000 | 10 | 4 | (5) | 2 | 3 | rotated (1) | rotated (1) | pass (0) | pass (0) |
| 0000 | 11 | 4 | 5 | (6) | 3 | rotated (1) | rotated (1) | rotated (1) | pass (0) |

Table 3 also shows the entry of each memory bank which is written corresponding to each address. For example, if the write address is '000000', then the first data input i0 is written to the first entry of Bank_0, i.e., entry 0; the second data input i1 is written to the first entry of Bank_1, i.e., entry 1, the third data input i2 is written to the first entry of Bank_2, i.e., entry 2. Additionally, if this were an order-4 buffer scheme, then a fourth data input i3 would be written to the first entry of Bank_3, i.e., entry 3.

When the write address is '000001', then the first data input i0 is written to the first entry of Bank_1, i.e., entry 1; the second data input i1 is written to the first entry of Bank_2, i.e., entry 2; the third data input i2 is written to the first entry of Bank_3, i.e., entry 3. If this were an order-4 buffer scheme, then a fourth data input i3 would be written to the second entry of Bank_0, i.e., entry 4. Notice that the fourth data input is not only wrapped around to Bank_0, but it is also rotated to write to the next consecutive entry. This is accomplished by selecting the rotated output of the demultiplexers of Bank_0's rotator 720.

As is shown in Table 3, for write address '000010', the rotated outputs of the demultiplexer of both the rotators to Bank_0 and Bank_1 are selected. For write address '000011', the rotated outputs of the demultiplexers of the rotators to Bank_0, Bank_1, and Bank_2 are selected. As can be seen by Table 3, because of the nature of the wraparound, Bank_3 need not be coupled to a rotator with pass-through outputs and rotated outputs.

For subsequent addresses to those shown in Table 3, the entries are incremented appropriately, but the demultiplexer functions remain based upon the lowest two bits of the write address 402.

Similar rotators in the read decoder 474 can be utilized for decoding the read address and providing read selects to the appropriate entries of the memory banks.

FIG. 12 shows a flow diagram of the steps taken by the write decoder 472 and the read decoder 474 in decoding an address and generating a select signal. The flow diagram begins at a block 900 and continues at block 902, at which an upper portion of the address is decoded. The write decoder decodes an upper portion of the write address, and the read decoder decodes an upper portion of the read address.

From block 902, the flow diagram continues at block 904, at which select signals are selectively generated based upon the upper portion of the address which was decoded in block 902. The write decoder may receive an input from a write count signal 432 which indicates the number of inputs which are valid. The write decoder will provide only write selects corresponding to inputs that are valid. In one embodiment, the read decoder may also receive an input from a read count signal and similarly selectively generate read selects. However, in an alternative embodiment, the read decoder provides a maximum number of read selects since any invalid data outputs can be masked off or ignored at a later stage. From block 904, operation continues at block 906.

At block 906, the select signals are provided to one or more rotators. For the write decoder, the write selects are provided to one or more rotators in the write decoder. For the read decoder, the read selects are provided to one or more rotators within the read decoder. From block 906, operation continues at block 908.

At block 908, a lower portion of the address is decoded. The write decoder decodes a lower portion of the write address, and the read decoder decodes a lower portion of the read address. From block 908, operation continues at block 910.

At block 910, the rotators of the decoders selectively rotate the respective select signals based on the lower portion of the address: the write decoder selectively rotates the write selects, and the read decoder selectively rotates the read selects. The selects are then routed to the plurality of memory banks of the memory array at block 912. From block 912, operation terminates at block 914.

FIG. 13 shows a view of bitlines of the memory array 420. As was shown in FIGS. 5 and 6, a conventional, non-interleaved buffer design would require three allocation write ports and three retirement read ports. Six metal tracks per bit of data would be required for implementing the three write bitlines i0, i1, and i2, and the three read bitlines o0, o1, and o2, of the array since each of the six bitlines would need to be coupled to each of the forty entries in the representative embodiment. However, using an interleaved design, a memory cell with one allocation write port and one retirement read port may be implemented using track sharing.

In this case the i0 input to the data cell of FIG. 6 is provided by four separate signals I0, I1, I2, and I3, each of which is routed to the ten entries of each memory bank of the representative embodiment. I0 is coupled to each of the entries of Bank_0; I1 is coupled to each of the entries of Bank_1; I2 is coupled to each of the entries of Bank_2; I3 is coupled to each of the entries of Bank_3. As a result, each of the bitlines has a loading from only 10 of the 40 entries of the representative embodiment.

Similarly, four separate output signals O0, O1, O2, and O3 are routed to each of the memory banks for reading from the memory array. O0 is coupled to the entries of Bank_0, O1 is coupled to the entries of Bank_1, and so forth.

FIG. 13 shows pictorially how tracks can be shared. Signals I0, I1, I2, and I3 start from Bank_0 and proceed down to the banks to which they are coupled, and signals O0, O1, O2, and O3 start from Bank_3 and proceed upward to the banks to which they are coupled. However, some of the metal tracks are discontinuous. For example, I2 does not extend into Bank_3, and O3 does not extend into Bank_2. Thus, the tracks for I2 and O3 can be shared. Similarly metal tracks for I1 and O2 can be shared, as well as tracks for I0 and O1. In an order-3 buffer scheme, there would be a savings of one metal track per bit of data.

In an order-4 buffer scheme, in which there would be four allocation write ports and four retirement read port, a conventional, non-interleaved buffer design would require eight metal tracks per bit of data. However, by using the track sharing as described above, only five tracks are needed. There is savings of three metal tracks per bit of data which reduces the die size of the memory array.

Thus, an apparatus and method for addressing and partitioning a multi-ported circular memory array is disclosed. The specific arrangements and methods described herein are merely illustrative of the principles of this invention. Numerous modifications in form and detail may be made without departing from the scope of the described invention. Although this invention has been shown in relation to a particular embodiment, it should not be considered so limited. Rather, the described invention is limited only by the scope of the appended claims.

What is claimed is:

1. In a reorder buffer of an out-of-order processor, a method of writing a predetermined number of data inputs to an array of memory cells in a clock cycle of the out-of-order processor, each of cells being coupled to a plurality of write bitlines and a plurality of read bitlines, with the read and write bitlines being shared among a set of discontinuous metal tracks, the memory cells being grouped into a plurality of memory banks, the memory banks having a plurality of outputs, the memory cells each having a single write port and a single read port, each of which is accessed in a circular order, the method comprising the steps of:

(a) routing each of a number of consecutively-addressed data items provided at the predetermined number of data inputs to a different memory bank of the plurality of memory banks;

(b) decoding a write address;

(c) providing a write select signal for each of the number of consecutively-addressed data items to one or more rotators, each of the one or more rotators being associated with a corresponding memory bank of the plurality of memory banks, with each write select corresponding to a particular entry in the plurality of memory banks.

2. A multi-ported reorder buffer operable to store N data inputs in a clock cycle of a processor, the multi-ported reorder buffer comprising:

an array of memory cells each of which is coupled to a plurality of write bitlines and a plurality of read bitlines, with the read and write bitlines being shared among a set of discontinuous metal tracks, the memory cells being grouped into a plurality of banks, the memory banks having a plurality of outputs, each of the memory cells having a single write port and a single read port, each of which is accessed in a circular order;

a plurality of multiplexers that route the N data inputs to the memory banks, wherein each of the N data inputs is routed to a different memory bank;

an address decoder coupled to receive a write address and coupled to provide a write select signal to each of the plurality of memory banks, the address decoder including:

an upper address decoder for providing an entry selector to each memory bank;

one or more rotators, each of the one or more rotators associated with a corresponding memory bank, the one or more rotators selectively rotating one or more of the entry selectors based upon a lower portion of the write address; and a de-interleavor coupled to receive a data output from each of the plurality of memory banks and coupled to provide up to one or more of the data outputs at an output of the multi-ported buffer.

3. A reorder buffer for use in an out-of-order processor comprising:

predetermined number of data inputs;

a predetermined number of data outputs;

an array of memory cells each of which is coupled to a plurality of write bitlines and a plurality of read bitlines, with the read and write bitlines being shared among a set of discontinuous metal tracks, the memory cells being grouped into a plurality of memory banks, the memory banks having a plurality of outputs, each of the memory cells having a single write port and a single read port, each of which is accessed in a circular order;

an interleavor that routes the predetermined number of data inputs to the memory banks;

a first decoder coupled to receive a write address and a write count signal, the first decoder providing a plurality of write enable signals to the memory banks, therefrom;

a second decoder coupled to receive a read address, the second decoder providing a plurality of read enable signals to the memory banks; and a de-interleavor that routes the plurality of outputs from the memory banks to the predetermined number of data outputs.

4. The reorder buffer of claim 3 wherein the reorder buffer is operable to store a first variable number of data inputs coupled to the predetermined number of data inputs and retrieve a second variable number of data outputs at the predetermined number of data outputs in one clock cycle of the processor.

* * * * *

UNITED STATES PATENT AND TRADEMARK OFFICE
CERTIFICATE OF CORRECTION

PATENT NO.    : 5,787,454
DATED         : July 28, 1998
INVENTOR(S)   : Joseph F. Rohlman It is certified that error appears in the above-identified patent and that said Letters Patent is hereby corrected as shown below:

On the title page: Item [54] and Column 1, line 2 and 3 delete "RECORDER"

and insert --REORDER-- delete "MULTI-PARTED"

and insert --MULTI-PORTED--

Signed and Sealed this

Fifth Day of January, 1999

Attest:

Attesting Officer

*Acting Commissioner of Patents and Trademarks*